United States Patent
Wu et al.

(10) Patent No.: US 12,248,022 B2
(45) Date of Patent: *Mar. 11, 2025

(54) METHOD AND APPARATUS FOR DETECTING DEFECTIVE LOGIC DEVICES

(71) Applicant: TAIWAN SEMICONDUCTOR MANUFACTURING COMPANY LTD., Hsinchu (TW)

(72) Inventors: Chi-Che Wu, Hsinchu (TW); Tsung-Yang Hung, Hsinchu County (TW); Ming-Yih Wang, Hsin-Chu (TW); Jia-Ming Guo, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 17 days.

This patent is subject to a terminal disclaimer.

(21) Appl. No.: 18/308,768

(22) Filed: Apr. 28, 2023

(65) Prior Publication Data

US 2023/0273257 A1     Aug. 31, 2023

Related U.S. Application Data

(63) Continuation of application No. 16/989,726, filed on Aug. 10, 2020, now Pat. No. 11,675,004.

(Continued)

(51) Int. Cl.
*G01R 31/3177*   (2006.01)
*G01R 31/30*     (2006.01)
*G01R 31/317*    (2006.01)

(52) U.S. Cl.
CPC ..... *G01R 31/3177* (2013.01); *G01R 31/3008* (2013.01); *G01R 31/31721* (2013.01); *G01R 31/31725* (2013.01)

(58) Field of Classification Search
CPC ........... G01R 31/3177; G01R 31/3008; G01R 31/31721; G01R 31/31725; G01R 31/52;
(Continued)

(56) References Cited

U.S. PATENT DOCUMENTS

| 5,602,489 A | 2/1997 | El-Kareh et al. |
| 7,342,405 B2 | 3/2008 | Eldridge et al. |

(Continued)

FOREIGN PATENT DOCUMENTS

| JP | 2001-266596 A | 9/2001 |
| TW | 200702678 | 1/2007 |

OTHER PUBLICATIONS

English Abstract of TW 200702678.
English Abstract of JP 2001266596 A.

*Primary Examiner* — Feba Pothen
(74) *Attorney, Agent, or Firm* — WPAT LAW; Anthony King

(57) ABSTRACT

An apparatus for testing a device under test (DUT) is provided. The apparatus includes a power supply device and a data generating device. The power supply device is configured to provide a first voltage and a second voltage to the DUT. The data generating device is configured to provide first data to the DUT. The power supply device is configured to provide the first voltage to the DUT in a first time duration. The data generating device is configured to provide the first data to the DUT in the first time duration. The power supply device is configured to provide the second voltage to the DUT in a second time duration after the first time duration. The second voltage is different from the first voltage.

20 Claims, 13 Drawing Sheets

Related U.S. Application Data

(60) Provisional application No. 63/024,874, filed on May 14, 2020.

(58) Field of Classification Search
CPC ............ G01R 31/3004; G01R 31/2601; G01R 31/2834; G01R 31/2836; G01R 31/2853
See application file for complete search history.

(56) References Cited

U.S. PATENT DOCUMENTS

2002/0199142  A1      12/2002   Gefen
2015/0253384  A1*     9/2015    Chen .............. G01R 31/318342
                                                                714/728

* cited by examiner

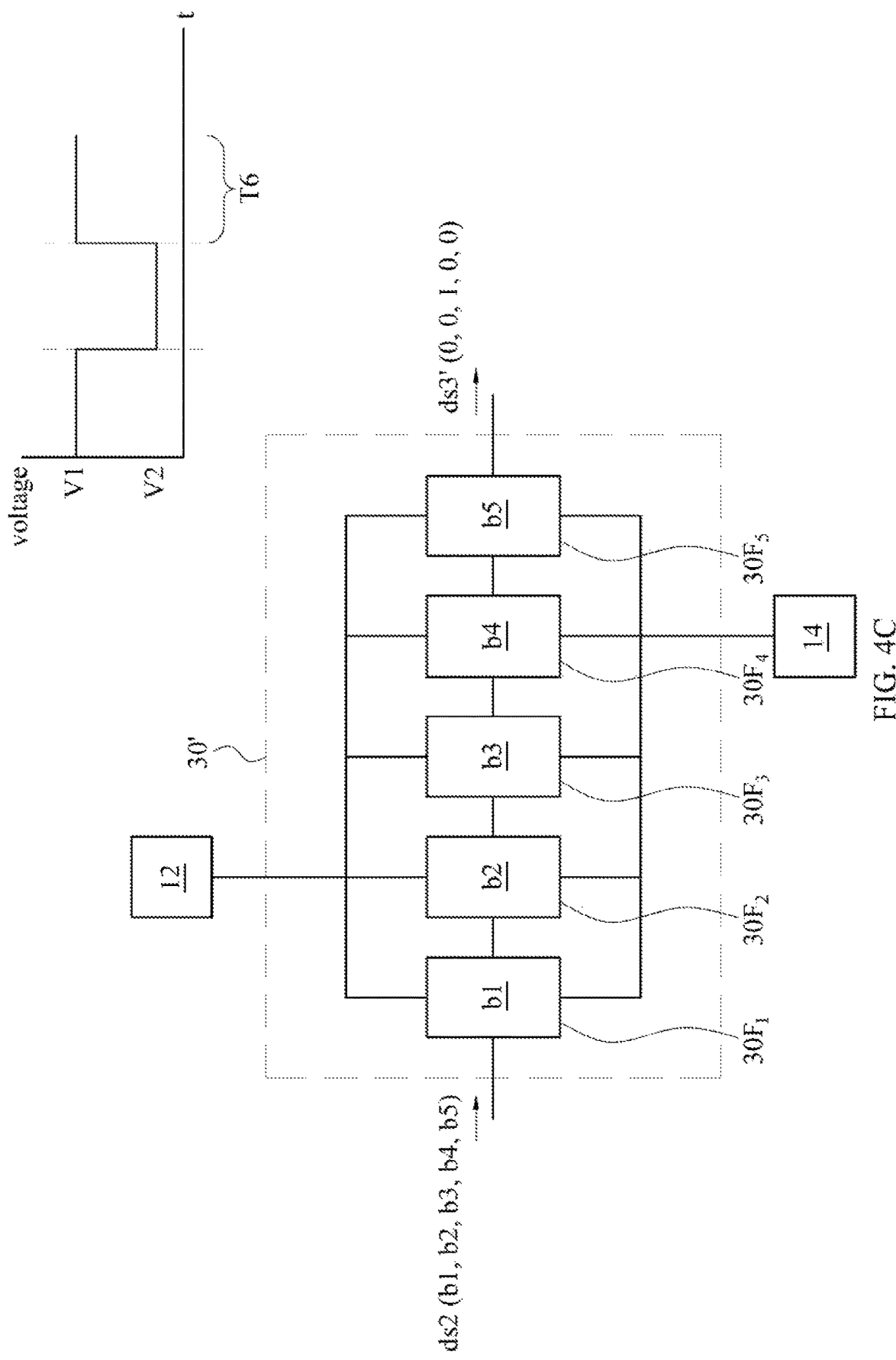

METHOD AND APPARATUS FOR DETECTING DEFECTIVE LOGIC DEVICES

PRIORITY CLAIM AND CROSS-REFERENCE

This application is a continuation application of prior-filed U.S. application Ser. No. 16/989,726, filed Aug. 10, 2020, and claims the benefit of previously filed provisional application No. 63/024,874, filed on May 14, 2020, the contents of which are incorporated herein by reference in its entirety.

BACKGROUND

Despite recent technological advances, tiny current leakage in a semiconductor device is sometimes difficult to detect, especially for the logic area of these devices. Current leakage may result from the manufacturing of the semiconductor device, for example, current leakage may be induced from structural imperfections of the semiconductor, such as imperfections of the FIN structure or poly remaining in the semiconductor. Current leakage in a semiconductor device might cause reliability concerns if it cannot be screened before shipment.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 4C illustrates a schematic view of an operation for testing a DUT, in accordance with some embodiments of the present disclosure.

DETAILED DESCRIPTION

Figure 1:
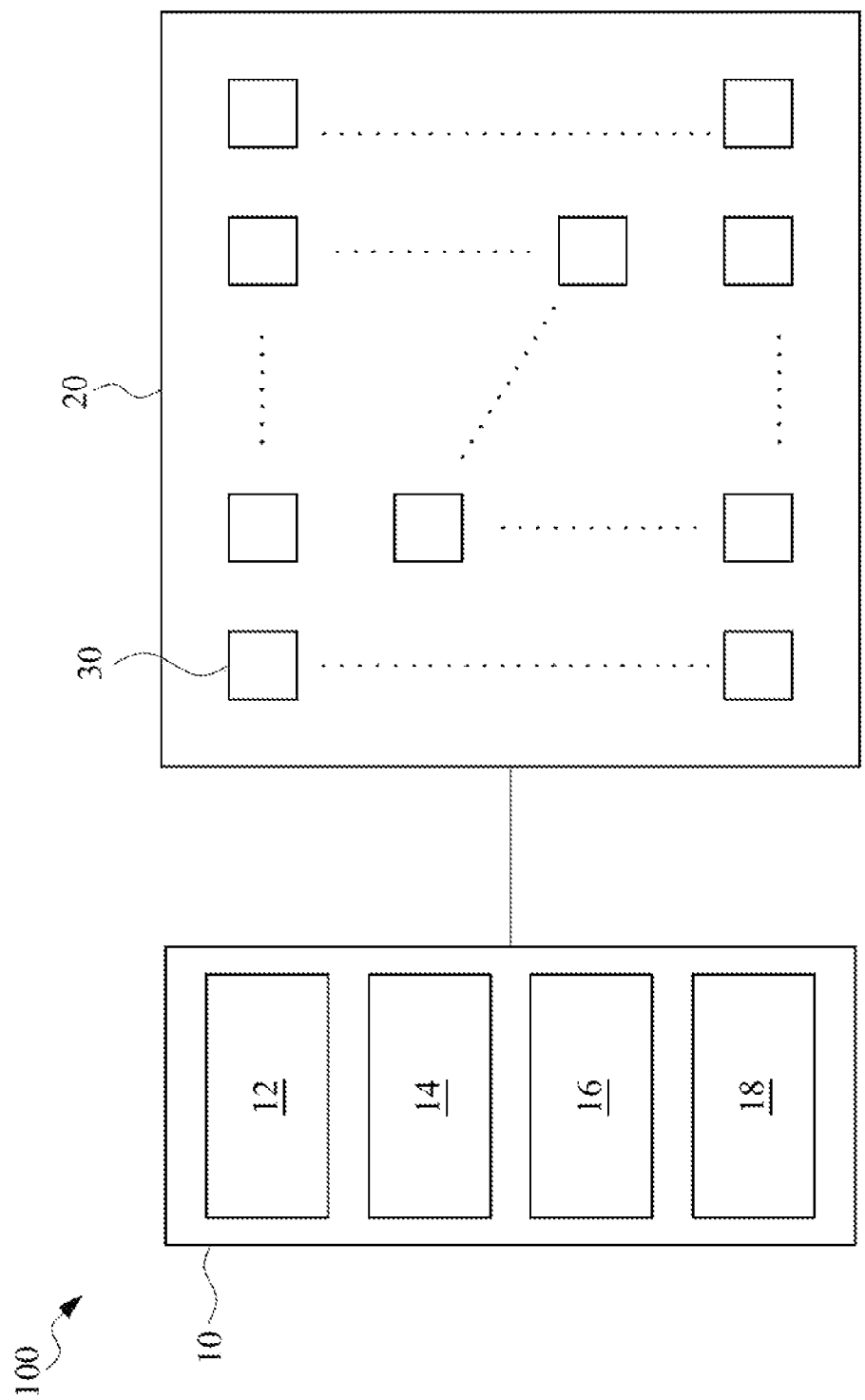
FIG. 1 illustrates a schematic view of an apparatus for testing a device under test (DUT), in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 illustrates a schematic view of an apparatus 100 for testing a device under test (DUT), in accordance with some embodiments of the present disclosure. The apparatus 100 can also be referred to as a system or equipment. The apparatus 100 includes a testing device 10 and a load board 20. The testing device 10 includes a power supply device 12, a clock device 14, a data generating device 16 and a comparison device 18. The testing device 10 can be electrically connected to the load board 20. Data, power, commands or signals can be communicated between the testing device 10 and the load board 20.

The power supply device 12, the clock device 14, the data generating device 16 and the comparison device 18 can be electrically connected to each other. Data, power, commands or signals can be communicated between the power supply device 12, the clock device 14, the data generating device 16 and/or the comparison device 18.

Although the power supply device 12, the clock device 14, the data generating device 16 and the comparison device 18 shown in FIG. 1 are included in the testing device 10, it can be contemplated that they may be disposed apart from each other. Although the power supply device 12, the clock device 14, the data generating device 16 and the comparison device 18 shown in FIG. 1 are individual devices, it can be contemplated that some of them can be integrated into a single device. In some embodiments, the power supply device 12, the clock device 14, the data generating device 16 and the comparison device 18 can be implemented by software or instruction codes stored in the hardware.

The power supply device 12 can be configured to provide power to the load board 20. The power supply device 12 can be configured to provide current to the load board 20. The power supply device 12 can be configured to provide voltages to the load board 20. The power supply device 12 can be configured to provide direct current (DC) to the load board 20. The power supply device 12 can be configured to provide alternating current (AC) to the load board 20.

The clock device 14 can be configured to provide clock signals to the load board 20. The data generating device 16 can be configured to provide data to the load board 20. In some embodiments, the data generating device 16 may provide analog signals to the load board 20. In some embodiments, the data generating device 16 may provide digital signals to the load board 20. In some embodiments, the data generating device 16 may provide data streams to the load board 20. In some embodiments, the data generating device 16 may provide bit streams to the load board 20.

The comparison device 18 can be configured to compare two data streams. The comparison device 18 can be configured to compare two bit streams. The comparison device 18 can be configured to compare a data stream provided by the data generating device 16 and a data stream received from the load board 20. The comparison device 18 can provide the comparison results to, for example, a processing unit (not shown) of the apparatus 100 for determining whether defects exist within the DUT.

One or several DUTs 30 can be mounted on the load board 20. The pins or connection pads of the DUTs 30 can be electrically connected to the pins or connection pads of the load board 20. Data, power, commands or signals can be communicated between the DUTs 30 and the load board 20. Data, power, commands or signals from the testing device 10 can be transmitted to the DUTs 30 mounted on the load board 20.

In some embodiments, the apparatus 100 can be configured to test only one DUT 30. In some embodiments, the apparatus 100 can be configured to test several DUTs 30 in parallel. In some embodiments, the apparatus 100 can be configured to test several DUTs 30 simultaneously.

In some embodiments, the testing device 10 may include a display screen (not shown). The comparison results provided by the comparison device 18 can be displayed on the display screen. In some embodiments, the comparison results provided by the comparison device 18 can be displayed to a user for he or she to determine whether any defects are found in the DUT 30. In some embodiments, the testing device 10 can determine whether defects are found in the DUT 30 based on the results provided by the comparison device 18. In some embodiments, the testing device 10 may issue visual or acoustic alerts when defects are found in the DUT 30.

Figure 2:
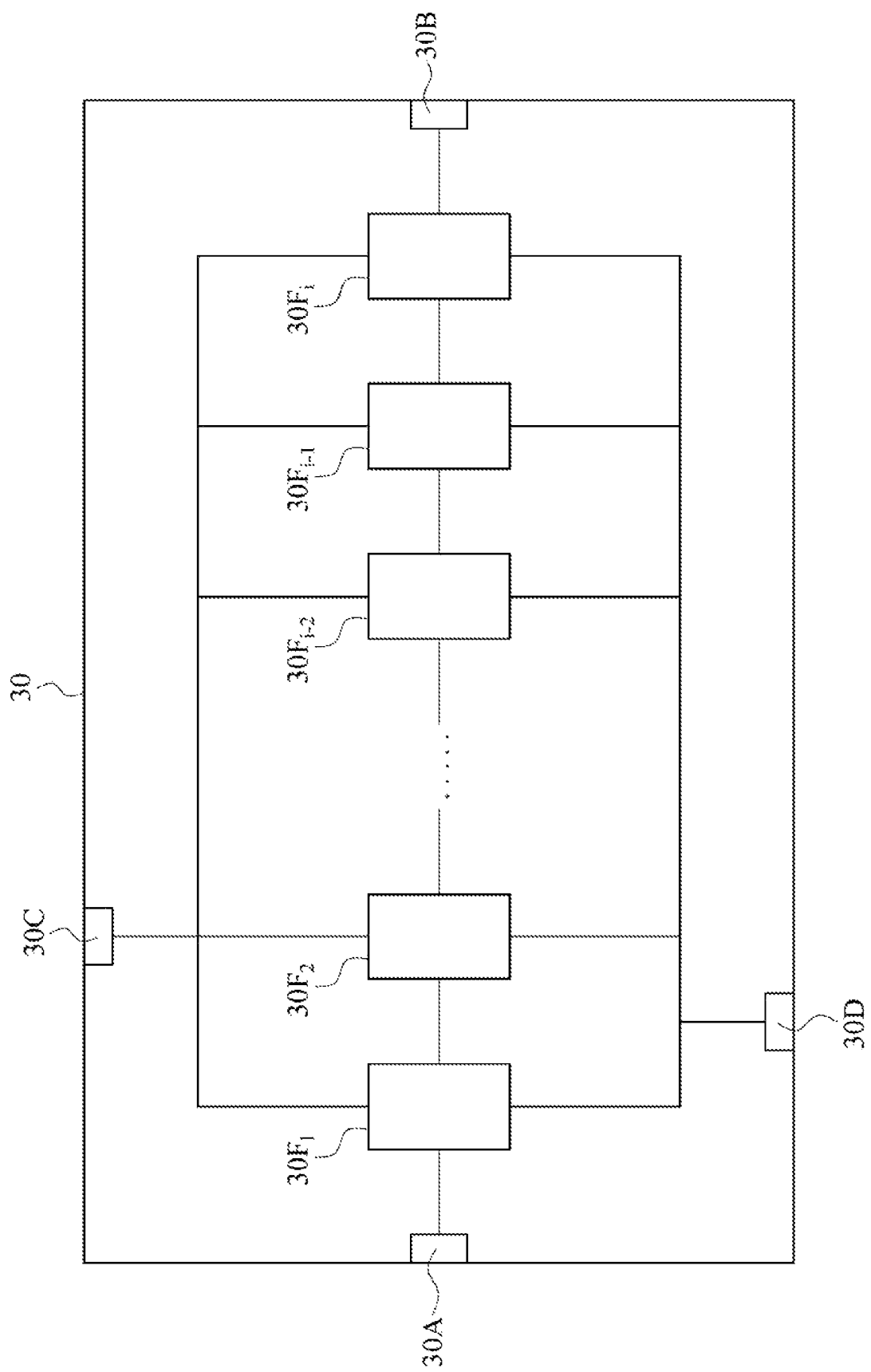
FIG. 2 illustrates a schematic view of a DUT, in accordance with some embodiments of the present disclosure.

FIG. 2 illustrates a schematic view of a DUT, in accordance with some embodiments of the present disclosure. FIG. 2 shows a schematic view of a DUT 30. In some embodiments, the DUT 30 may be a semiconductor device. In some embodiments, the DUT 30 may be a semiconductor chip.

The DUT 30 may include several input/output (I/O) ports. The DUT 30 includes ports 30A, 30B, 30C and 30D. In some embodiments, the DUT 30 may include more I/O ports. In some embodiments, the DUT 30 may include fewer I/O ports. The DUT 30 may receive data, power, commands or signals from the ports 30A, 30B, 30C and 30D. The DUT 30 may output data, power, commands or signals through the ports 30A, 30B, 30C and 30D.

The DUT 30 may include several logic units. Referring to FIG. 2, the DUT 30 includes logic units $30F_1$, $30F_2$, ..., $30F_{i-1}$, $30F_{i-2}$ and $30F_i$. The index "i" is a positive integer. The logic units $30F_1$, $30F_2$, ..., $30F_{i-1}$, $30F_{i-2}$ and $30F_i$ can be connected in series. The logic unit $30F_1$ may receive data from the port 30A. The logic units $30F_1$, $30F_2$, ..., $30F_{i-1}$, $30F_{i-2}$ and $30F_i$ may be merely a portion of the DUT 30. The DUT 30 may include additional units/circuits other than the logic units $30F_1$, $30F_2$, ..., $30F_{i-1}$, $30F_{i-2}$ and $30F_i$.

The logic units $30F_1$, $30F_2$, ..., $30F_{i-1}$, $30F_{i-2}$ and $30F_i$ can be the portion that is used for data storage for the DUT 30. In some embodiments, logic units $30F_1$, $30F_2$, ..., $30F_{i-1}$, $30F_{i-2}$ and $30F_i$ may occupy more than 20% of the area of the DUT 30. If defects exist in any of the logic units $30F_1$, $30F_2$, ..., $30F_{i-1}$, $30F_{i-2}$ and $30F_i$, the performance of the DUT 30 can be adversely affected. If defects exist in any of the logic units $30F_1$, $30F_2$, ..., $30F_{i-1}$, $30F_{i-2}$ and $30F_i$ the DUT 30 may not work properly.

The data received from the port 30A can be transmitted, unit by unit, from the logic units $30F_1$ to the logic units $30F_i$. For example, the logic unit $30F_1$ may forward the data received from the port 30A to the logic unit $30F_2$. The logic $30F_2$ may forward the data received from the logic unit $30F_1$ to the logic unit in the next stage (i.e., $30F_3$), and so on. The logic unit $30F_i$ may output data through the port 30B. The data streams provided through the port 30A, after transmission through the logic units $30F_1$, $30F_2$, ..., $30F_{i-1}$, $30F_{i-2}$ and $30F_i$, can be outputted by the port 30B. In other embodiments, the data can be transmitted to the port 30A in parallel. For example, a data stream can be inputted to the logic units $30F_1$ to the logic units $30F_i$ simultaneously.

In some embodiments, power can be provided to the DUT 30 through the port 30C. In some embodiments, current/voltage can be provided to the DUT 30 through the port 30C. The current/voltage received from the port 30C can be provided to each of the logic units $30F_1$, $30F_2$, ..., $30F_{i-1}$, $30F_{i-2}$ and $30F_i$. In some embodiments, signals can be provided to the DUT 30 through the port 30D. In some embodiments, clock signals can be provided to the DUT 30 through the port 30D. The clock signals received from the port 30D can be provided to each of the logic units $30F_1$, $30F_2$, ..., $30F_{i-1}$, $30F_{i-2}$ and $30F_i$.

In some embodiments, the logic units $30F_1$, $30F_2$, ..., $30F_{i-1}$, $30F_{i-2}$ and $30F_i$ can be flip flops. In some embodiments, the logic units $30F_1$, $30F_2$, ..., $30F_{i-1}$, $30F_{i-2}$ and $30F_i$ can be flip flops that include data storage capability.

Figure 3A:
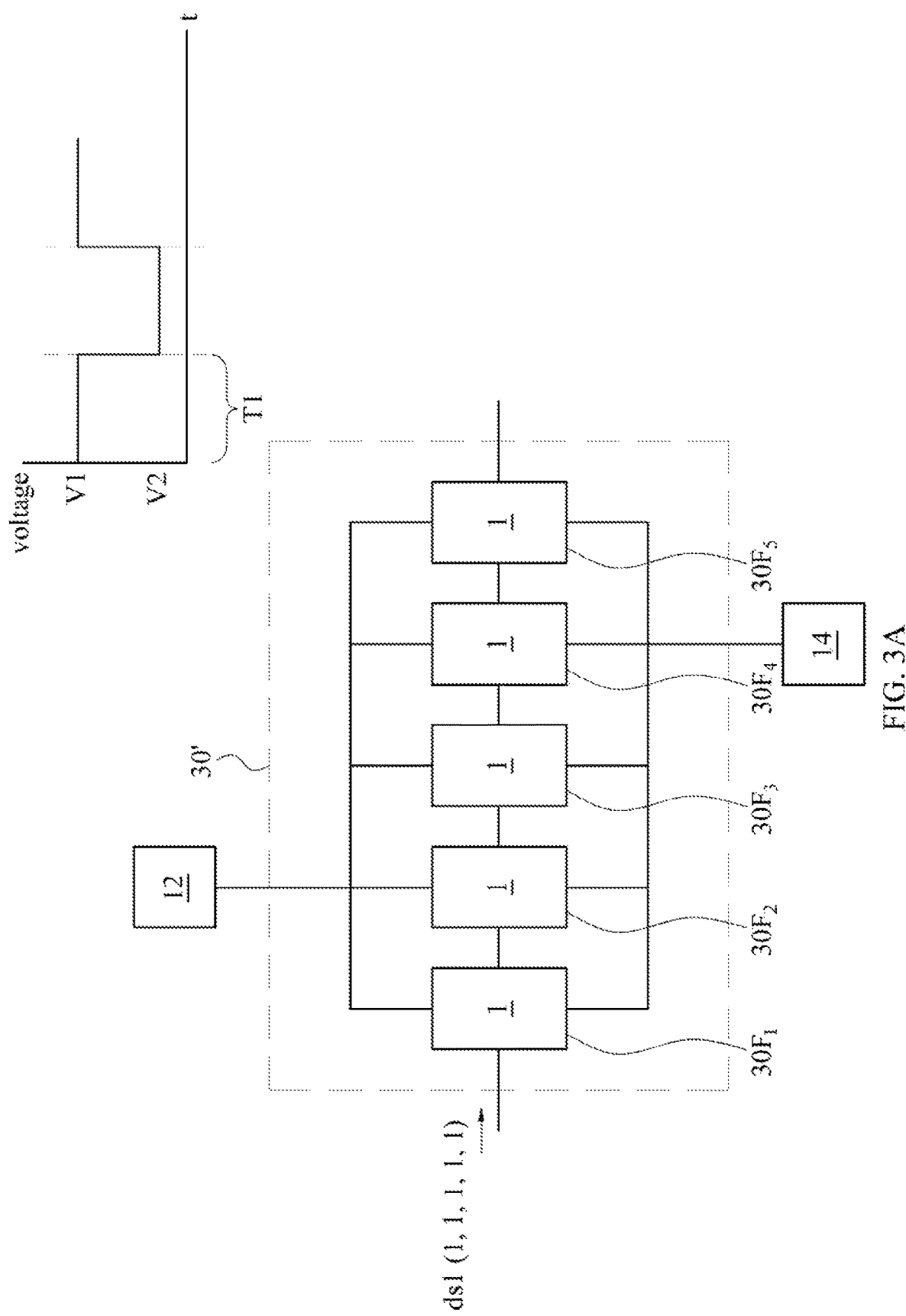
FIG. 3A illustrates a schematic view of an operation for testing a DUT, in accordance with some embodiments of the present disclosure.

FIG. 3A illustrates a schematic view of an operation for testing a DUT, in accordance with some embodiments of the present disclosure. FIG. 3 shows an operation for testing a DUT 30'. For simplicity of illustration, the DUT 30' includes only five logic units $30F_1$, $30F_2$, $30F_3$, $30F_4$ and $30F_5$. It can be contemplated that the operation shown in FIG. 3A can also be applied to the DUT 30 which includes logic units $30F_1$, $30F_2$, ..., $30F_{i-1}$, $30F_{i-2}$ and $30F_i$.

For simplicity of illustration, only the power supply device 12 and the clock device 14 are depicted together with the DUT 30' in FIG. 3A. It can be contemplated that the DUT 30' is mounted on the load board 20, and is able to receive signals/data from the testing device 10 or to transmit signals/data to the testing device 10. For simplicity of illustration, I/O ports of the DUT 30' are omitted in FIG. 3A. It can be contemplated that the DUT 30' includes I/O ports similar to the ports 30A, 30B, 30C and 30D shown in FIG. 2.

The operation shown in FIG. 3A is conducted during time duration T1. During the time duration T1, the power supply device 12 is configured to provide a voltage V1 to the logic units $30F_1$, $30F_2$, $30F_3$, $30F_4$ and $30F_5$. During the time duration T1, data ds1 is provided, for example, by the data generating device 16, to the DUT 30'. The data ds1 may include several bits. The number of bits of the data ds1 can be identical to the number of the logic units. In FIG. 3A, the data ds1 including five bits of "1" is provided to the DUT 30' for testing the logic units $30F_1$, $30F_2$, $30F_3$, $30F_4$ and $30F_5$. In some embodiments, a number i of bits should be provided to the DUT 30 shown in FIG. 2 if the logic units $30F_1$, $30F_2$, ..., $30F_{i-1}$, $30F_{i-2}$ and $30F_i$ need to be tested.

The clock device 14 is configured to provide a clock signal to the DUT 30' during the time duration T1. The clock signal provided by the clock device 14 may include several signal edges. Some of the signal edges of the clock signal may include a rising edge (or positive edge), which is a low-to-high transition of the clock signal. Some of the signal edges of the clock signal may include a falling edge (or negative edge), which is the high-to-low transition of the clock signal.

A signal edge of the clock signal may trigger a logic unit to capture a bit transmitted from its previous stage. A signal edge of the clock signal may trigger a logic unit to shift a bit to its next stage. For example, a signal edge of the clock signal can trigger the logic unit $30F_1$ to capture a bit transmitted from the data generating device 16. Another signal edge of the clock signal can trigger the logic unit $30F_1$ to shift a bit to the logic unit $30F_2$. Similarly, a signal edge of the clock signal can trigger the logic unit $30F_2$ to capture a bit transmitted from the logic unit $30F_1$. Another signal edge of the clock signal can trigger the logic unit $30F_2$ to shift a bit to the logic unit $30F_3$.

In the example shown in FIG. 3A, the data ds1 can be transmitted to and stored in the logic units $30F_1$, $30F_2$, $30F_3$, $30F_4$ and $30F_5$ after five signal edges of the clock signal.

Figure 3B:
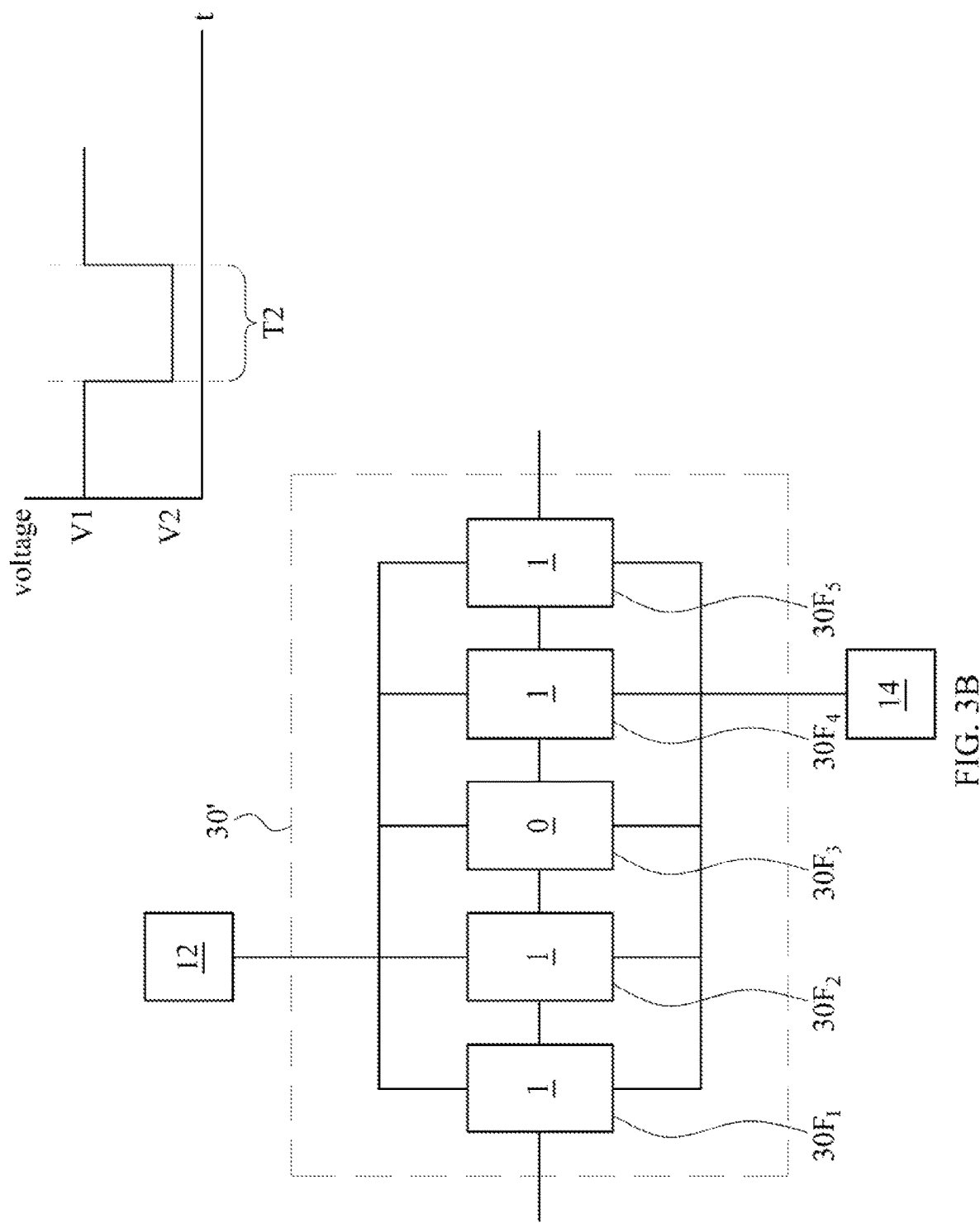
FIG. 3B illustrates a schematic view of an operation for testing a DUT, in accordance with some embodiments of the present disclosure.

FIG. 3B illustrates a schematic view of an operation for testing a DUT, in accordance with some embodiments of the present disclosure. The operation shown in FIG. 3B can be conducted during time duration T2 after the time duration T1. During the time duration T2, the clock device 14 is configured to stop providing clock signals to the DUT 30'. In some embodiments, the clock device 14 is configured to provide a clock signal that does not include signal edges to the DUT 30'.

During the time duration T2, the power supply device 12 is configured to provide a voltage V2 to the DUT 30'. The voltage V2 includes a level different from that of the voltage V1. The voltage V2 includes a level lower than that of the voltage V1. The level of the voltage V2 can be adjusted in accordance with the characteristics of the DUT 30'. The characteristics of the DUT 30' may include, for example, but are not limited to, the technologies of manufacturing the DUT 30', the application field of the DUT 30', the operation conditions of the DUT 30', or the functions of the DUT 30'.

In some embodiments, the voltage V2 can be 20% less than the voltage V1. In some embodiments, the voltage V2 can be 50% less than the voltage V1. In some embodiments, the voltage V2 can be 80% less than the voltage V1. In some embodiments, a ratio of the voltage V2 to the voltage V1 ranges from 80% to 20%.

The time duration T2 can last for more than 50 milliseconds (ms). The time duration T2 can last for more than 80 ms. The time duration T2 can last for more than 100 ms. The voltage V2 can be applied to the DUT 30' for more than 100 ms. The time duration T2 can be adjusted in accordance with the characteristics of the DUT 30'. The characteristics of the DUT 30' may include, for example, but are not limited to, the technologies of manufacturing the DUT 30', the application field of the DUT 30', the operation conditions of the DUT 30', or the functions of the DUT 30'.

If defects exist in some of the logic units $30F_1$, $30F_2$, $30F_3$, $30F_4$ and $30F_5$, current leakage may occur during the time duration T2. The current leakage may affect or change the bit stored in the logic units. FIG. 3B shows an example of defects existing within the logic unit $30F_3$, and the bit stored in the logic unit $30F_3$ changes from "1" to "0" during the time duration T2. In some embodiments, defects may exist in a logic unit different from the logic unit $30F_3$.

Figure 3C:
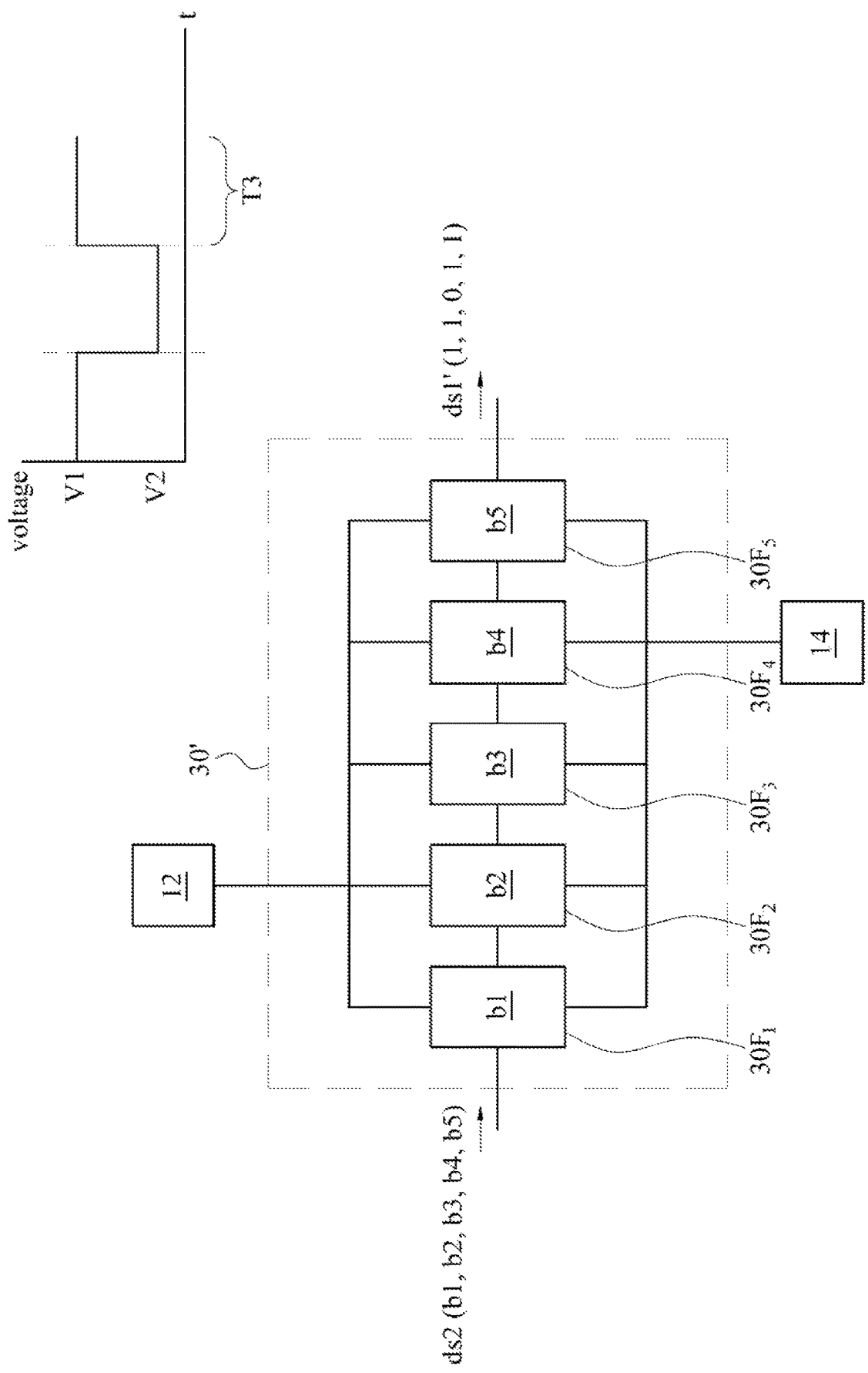
FIG. 3C illustrates a schematic view of an operation for testing a DUT, in accordance with some embodiments of the present disclosure.

FIG. 3C illustrates a schematic view of an operation for testing a DUT, in accordance with some embodiments of the present disclosure. The operation shown in FIG. 3C can be conducted during time duration T3 after the time duration T2. During the time duration T3, the power supply device 12 is configured to provide a voltage V1 to the DUT 30'. During the time duration T3, the clock device 14 is configured to provide a clock signal to the DUT 30'.

During the time duration T3, data ds2 is provided, for example, by the data generating device 16, to the DUT 30'. The data ds2 can have an identical number of bits to that of the data ds1. The data ds2 can have an identical number of digits to that of the data ds1. The data ds2 may include bits b1, b2, b3, b4 and b5. Bits b1, b2, b3, b4 and b5 can be fed into the logic units $30F_1$, $30F_2$, $30F_3$, $30F_4$ and $30F_5$ in sequence. Bits b1, b2, b3, b4 and b5 can be fed into the logic units $30F_1$, $30F_2$, $30F_3$, $30F_4$ and $30F_5$ sequentially, triggered by the signal edges of the clock signal provided by the clock device 14.

The purpose of feeding the data ds2 into the DUT 30' is to have the data ds1' outputted by the DUT 30'. Therefore, the data ds2 can include arbitrary combinations of bits "0" or "1." After the bits b1, b2, b3, b4 and b5 are fed into the DUT 30', data ds1' can be outputted from the DUT 30'. The data ds1' can include the bits that are stored in the logic units $30F_1$, $30F_2$, $30F_3$, $30F_4$ and $30F_5$, at the end of the time duration T2.

The data ds1' shown in FIG. 3C can be compared with the data ds1 shown in FIG. 3A, for example, by the comparison device 18. If some of the bits of the data ds1' are different from those of the data ds1, it can be determined, for example, by the testing device 10, that defects exist in the DUT 30'. In some embodiments, the testing device 10 may issue visual or acoustic alerts when defects are found in the DUT 30'.

Figure 4A:
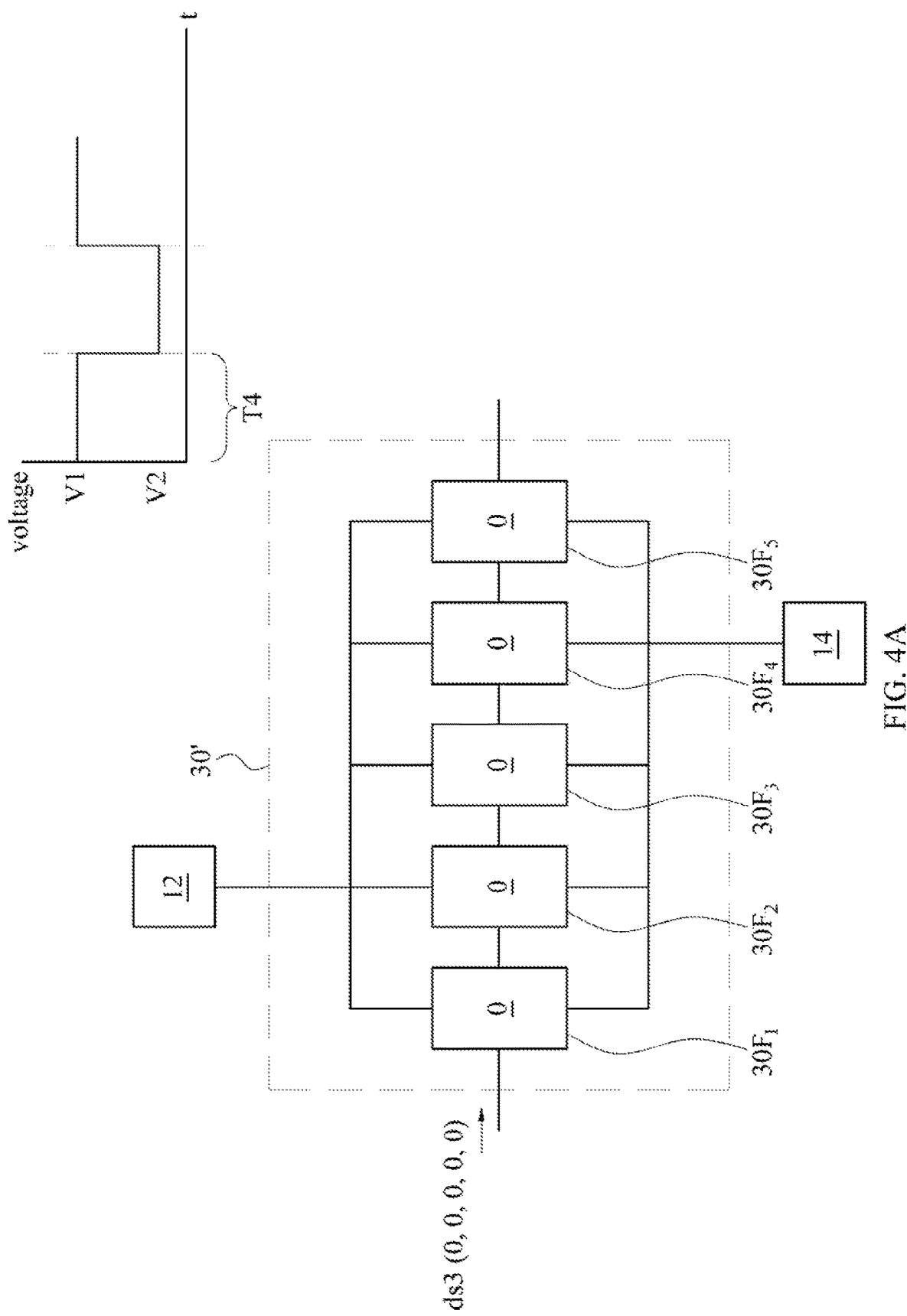
FIG. 4A illustrates a schematic view of an operation for testing a DUT, in accordance with some embodiments of the present disclosure.

FIG. 4A illustrates a schematic view of an operation for testing a DUT, in accordance with some embodiments of the present disclosure. The operation shown in FIG. 4A can be conducted during time duration T4. In some embodiments, the operation shown in FIG. 4A can be conducted after the operation shown in FIG. 3C, and the time duration T4 can be after the time duration T3. In some embodiments, the operation shown in FIG. 4A can be conducted independent of the operations shown in FIGS. 3A, 3B and 3C.

During the time duration T4, the power supply device 12 is configured to provide a voltage V1 to the DUT 30'. During the time duration T4, the clock device 14 is configured to provide a clock signal to the DUT 30'.

During the time duration T4, data ds3 is provided, for example, by the data generating device 16, to the DUT 30'. The data ds3 may include several bits. The number of bits of the data ds3 can be identical to the number of the logic units. The data ds3 can have an identical number of bits/digits to that of the data ds1. The data ds3 can be different from the data ds1 shown in FIG. 3A. In FIG. 4A, the data ds3 including five bits of "0" is provided to the DUT 30' for testing the logic units $30F_1$, $30F_2$, $30F_3$, $30F_4$ and $30F_5$. In some embodiments, a number i of bits should be provided to the DUT 30 shown in FIG. 2 if the logic units $30F_1$, $30F_2$, ..., $30F_{i-1}$, $30F_{i-2}$ and $30F_i$ need to be tested.

In the example shown in FIG. 4A, the data ds3 can be transmitted to and stored in the logic units $30F_1$, $30F_2$, $30F_3$, $30F_4$ and $30F_5$ after five signal edges of the clock signal provided by the clock device 14.

Figure 4B:
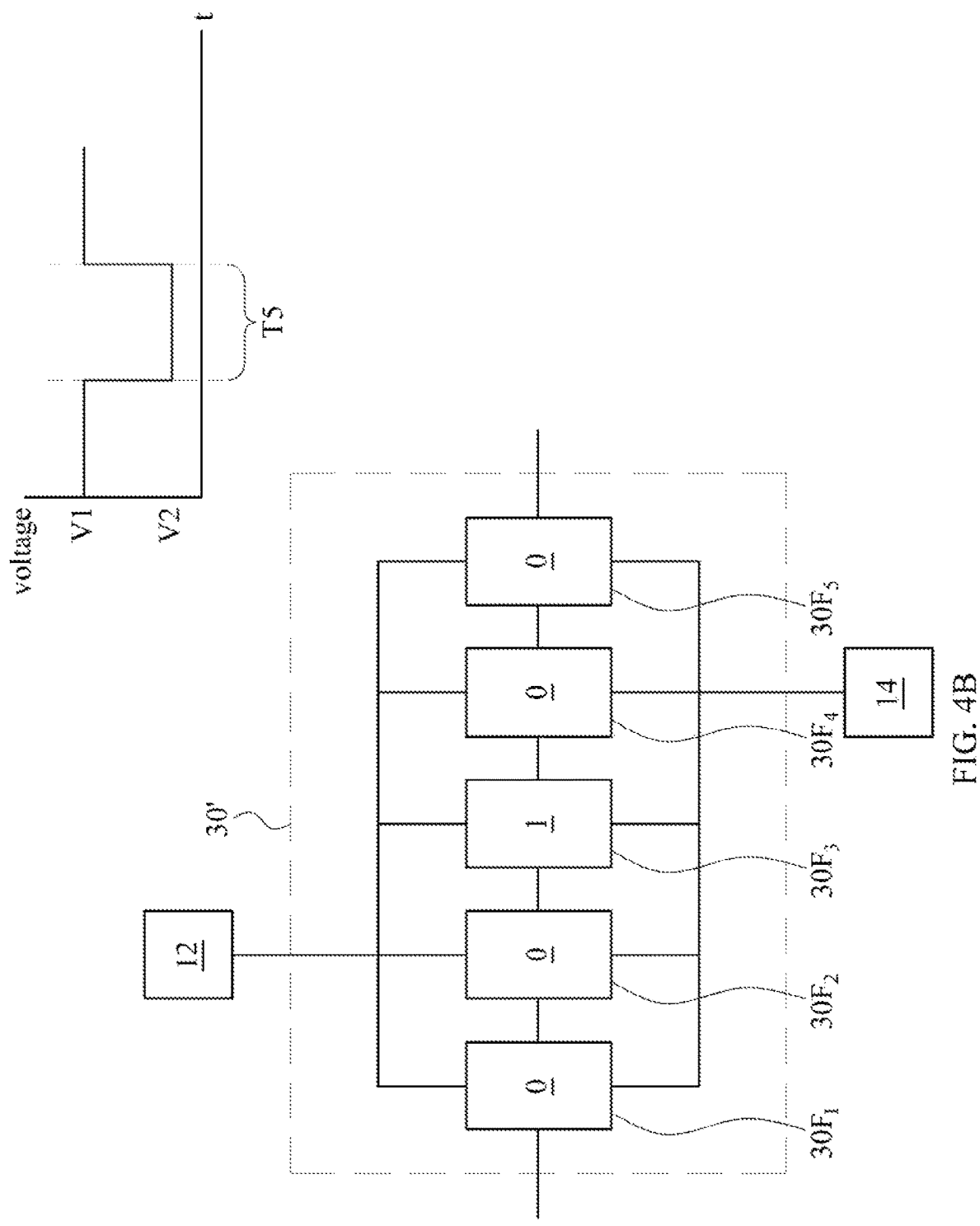
FIG. 4B illustrates a schematic view of an operation for testing a DUT, in accordance with some embodiments of the present disclosure.

FIG. 4B illustrates a schematic view of an operation for testing a DUT, in accordance with some embodiments of the present disclosure. The operation shown in FIG. 4B can be conducted during time duration T5 after the time duration T4. During the time duration T5, the clock device 14 is configured to stop providing clock signals to the DUT 30'. In some embodiments, the clock device 14 is configured to provide a clock signal that does not include signal edges to the DUT 30'.

During the time duration T5, the power supply device 12 is configured to provide a voltage V2 to the DUT 30'. The voltage V2 includes a level different from that of the voltage V1. The voltage V2 includes a level lower than that of the voltage V1. The level of the voltage V2 can be adjusted in accordance with the characteristics of the DUT 30'. The characteristics of the DUT 30' may include, for example, but are not limited to, the technologies of manufacturing DUT 30', the application field of the DUT 30', the operation conditions of the DUT 30', or the functions of the DUT 30'.

In some embodiments, the voltage V2 can be 20% less than the voltage V1. In some embodiments, the voltage V2 can be 50% less than the voltage V1. In some embodiments, the voltage V2 can be 80% less than the voltage V1. In some embodiments, a ratio of the voltage V2 to the voltage V1 ranges from 80% to 20%.

The time duration T5 can last for more than 50 milliseconds (ms). The time duration T5 can last for more than 80 ms. The time duration T5 can last for more than 100 ms. The voltage V2 can be applied to the DUT 30' for more than 100 ms. The time duration T5 can be adjusted in accordance with the characteristics of the DUT 30'. The characteristics of the DUT 30' may include, for example, but are not limited to, the technologies of manufacturing the DUT 30', the application field of the DUT 30', the operation conditions of the DUT 30', or the functions of the DUT 30'.

If defects exist in some of the logic units $30F_1$, $30F_2$, $30F_3$, $30F_4$ and $30F_5$, current leakage may occur during the time duration T5. The current leakage may affect or change the bit stored in the logic units. FIG. 4B shows an example of defects existing within the logic unit $30F_3$, and the bit stored in the logic unit $30F_3$ changes from "0" to "1" during the time duration T5. In some embodiments, defects may exist in a logic unit different from the logic unit $30F_3$.

FIG. 4C illustrates a schematic view of an operation for testing a DUT, in accordance with some embodiments of the present disclosure. The operation shown in FIG. 4C can be conducted during time duration T6 after the time duration T5. During the time duration T6, the power supply device 12 is configured to provide a voltage V1 to the DUT 30'. During the time duration T6, the clock device 14 is configured to provide a clock signal to the DUT 30'.

During the time duration T6, data ds2 is provided, for example, by the data generating device 16, to the DUT 30'. The data ds2 may include bits b1, b2, b3, b4 and b5. Bits b1, b2, b3, b4 and b5 can be fed into the logic units $30F_1$, $30F_2$, $30F_3$, $30F_4$ and $30F_5$ in sequence. Bits b1, b2, b3, b4 and b5 can be fed into the logic units $30F_1$, $30F_2$, $30F_3$, $30F_4$ and $30F_5$ sequentially, triggered by the signal edges of the clock signal provided by the clock device 14.

The purpose of feeding the data ds2 into the DUT 30' is to have the data ds1' outputted by the DUT 30'. Therefore, the data ds2 can include arbitrary combinations of bits "0" or "1." After the bits b1, b2, b3, b4 and b5 are fed into the DUT 30', data ds3' can be outputted from the DUT 30'. The data ds3' can include the bits that stored in the logic units $30F_1$, $30F_2$, $30F_3$, $30F_4$ and $30F_5$, at the end of the time duration T5.

The data ds3' shown in FIG. 4C can be compared with the data ds3 shown in FIG. 4A, for example, by the comparison device 18. If some of the bits of the data ds3' are different from those of the data ds3, it can be determined, for example, by the testing device 10, that defects exist in the DUT 30'. In some embodiments, the testing device 10 may issue visual or acoustic alerts when defects are found in the DUT 30'.

Figure 5A:
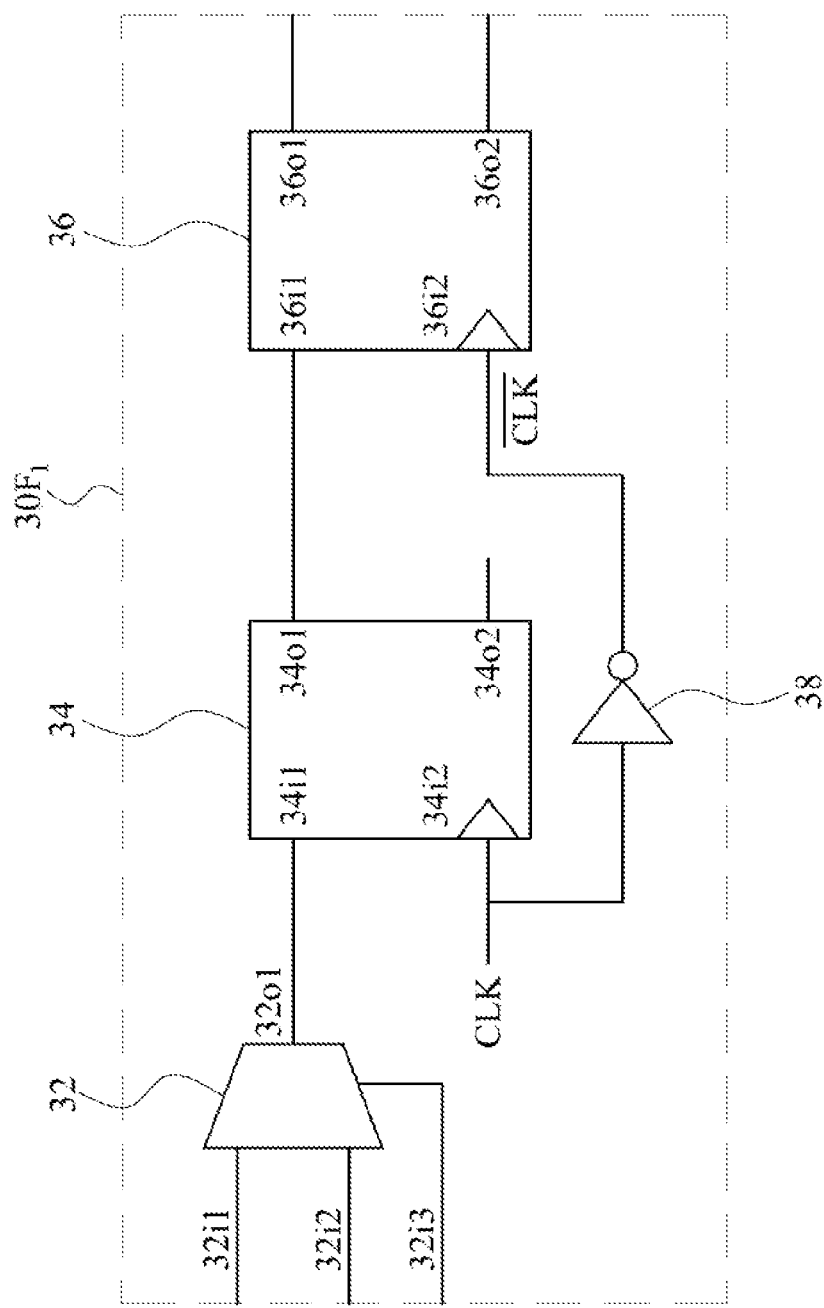
FIG. 5A illustrates a schematic view of a logic unit, in accordance with some embodiments of the present disclosure.

FIG. 5A illustrates a schematic view of a logic unit, in accordance with some embodiments of the present disclosure. FIG. 5A shows a logic unit $30F_1$. The logic unit $30F_1$ includes a multiplexer 32, a flip flop 34, a flip flop 36 and an inverter 38. The multiplexer 32 can be electrically connected to the flip flop 34. The flip flop 34 can be electrically connected to the flip flop 36. The inverter 38 can be connected between the flip flop 34 and the flip flop 36.

The multiplexer 32 includes input ports 32i1, 32i2 and 32i3. The multiplexer 32 includes an output port 32o1. The flip flop 34 includes input ports 34i1 and 34i2. The flip flop 34 includes output ports 34o1 and 34o2. The flip flop 36 includes input ports 36i1 and 36i2. The flip flop 36 includes output ports 36o1 and 36o2. The output port 32o1 of the multiplexer 32 can be connected to the input port 34i1 of the flip flop 34. The output port 34o1 of the flip flop 34 can be connected to the input port 36i1 of the flip flop 36. The inverter 38 can be connected between the input port 34i2 of the flip flop 34 and the input port 36i2 of the flip flop 36.

In some embodiments, the input port 32i2 of the multiplexer 32 may receive the test data (for example, the data ds1, ds2 and ds3 shown in FIGS. 3A-4C) provided by the data generating device 16. In some embodiments, the input port 34i2 of the flip flop 34 may receive a clock signal CLK provided by the clock device 14. The clock signal CLK provided by the clock device 14 can be inverted by the inverter 38 to be $\overline{CLK}$, before it is received by the input port 36i2 of the flip flop 36.

The flip flop 34 can be a scan D flip flop. The flip flop 36 can be a scan D flip flop. The flip flop 34 can be a master flip flop. The flip flop 36 can be a slave flip flop. The flip flops 34 and 36 can be configured as a latch for data storage.

The data outputted by the output port 34o1 of the flip flop 34 can be an inversion of the data outputted by the output port 34o2 of the flip flop 34. For example, if the data outputted by output port 34o1 of the flip flop 34 is a logic "0," then the data outputted by output port 34o2 of the flip flop 34 will be a logic "1," and vice versa. The data outputted by the output port 36o1 of the flip flop 36 can be an inversion of the data outputted by the output port 36o2 of the flip flop 36. For example, if the data outputted by output port 36o1 of the flip flop 36 is a logic "0," then the data outputted by output port 36o2 of the flip flop 36 will be a logic "1," and vice versa.

Figure 5B:
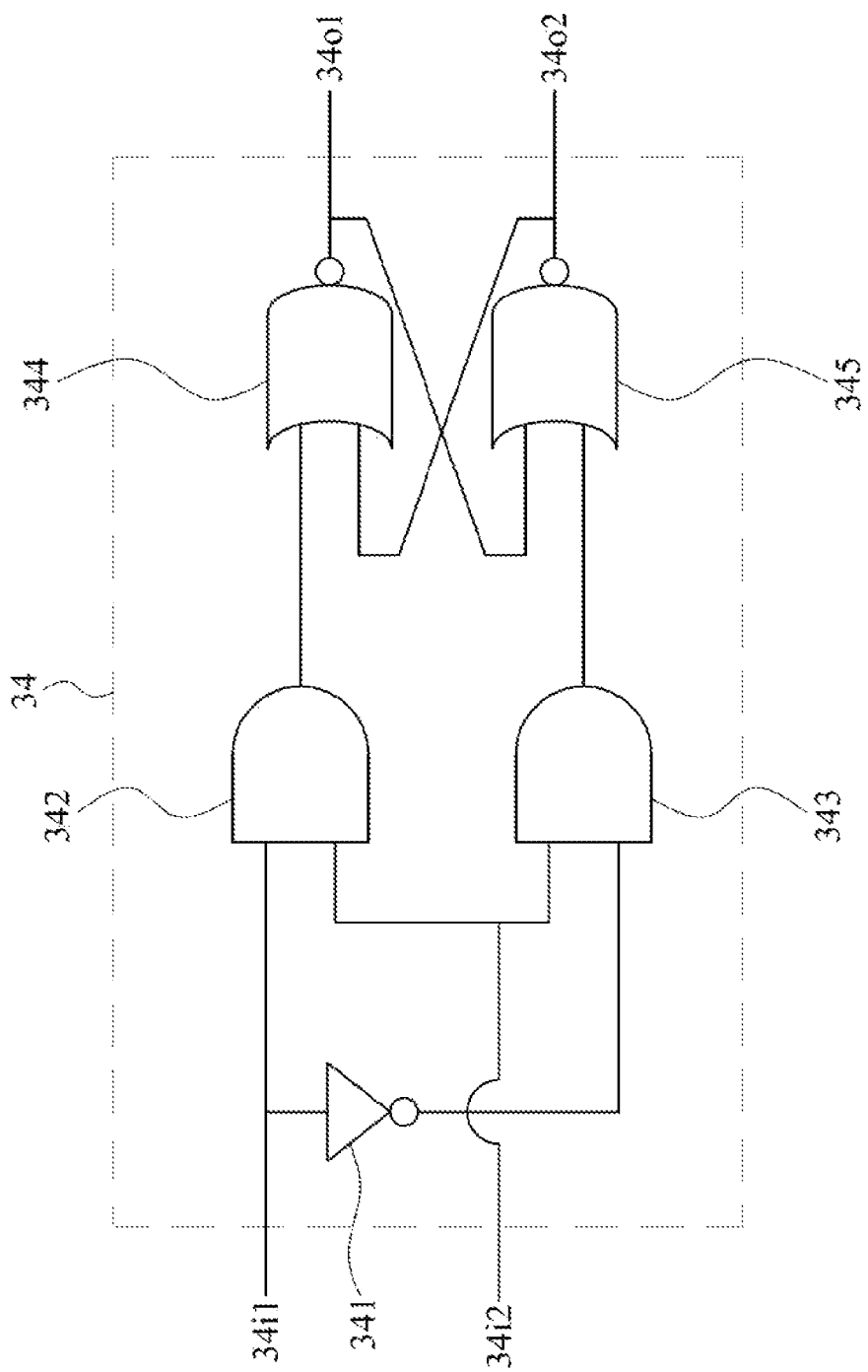
FIG. 5B illustrates a schematic view of a logic unit, in accordance with some embodiments of the present disclosure.

FIG. 5B illustrates a schematic view of a logic unit, in accordance with some embodiments of the present disclosure. FIG. 5B shows one of the possible implementations of the flip flop 34. The flip flop 36 can be implemented in a manner similar to that shown in FIG. 5B.

Referring to FIG. 5B, the flip flop 34 includes an inverter 341, AND gates 342 and 343, and NOR gates 344 and 345. The input port 34i1 of the flip flop 34 can receive data provided by another circuit (for example, the multiplexer 32). The input port 34i2 of the flip flop 34 can receive signals provided by another circuit (for example, the clock device 14).

The data outputted by the output port 34o1 of the flip flop 34 can be an inversion of the data outputted by the output port 34o2 of the flip flop 34. For example, if the data outputted by output port 34o1 of the flip flop 34 is a logic "0," then the data outputted by output port 34o2 of the flip flop 34 will be a logic "1," and vice versa.

Figure 6:
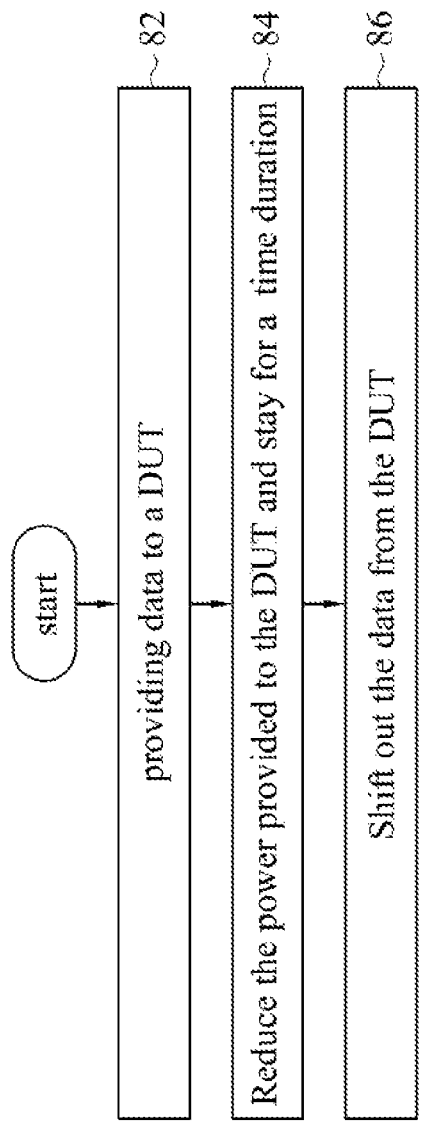
FIG. 6 illustrates a flowchart including various operations of a method for testing a DUT, in accordance with some embodiments of the present disclosure.

FIG. 6 illustrates a flowchart including various operations of a method for testing a DUT, in accordance with some embodiments of the present disclosure.

In operation 82, data is provided to a DUT. For example, the data ds1 can be provided to the DUT 30'. In operation 84, the power provided to the DUT is reduced, and the reduced power is provided to the DUT for a time duration. For example, the power provided to the DUT 30' is reduced from the voltage V1 to the voltage V2, and the voltage V2 is provided to the DUT 30' for the time duration T2. In operation 86, the data of the DUT is shifted out. For example, the data stored in the DUT 30' can be shifted out as the data ds1'.

Figure 7A:
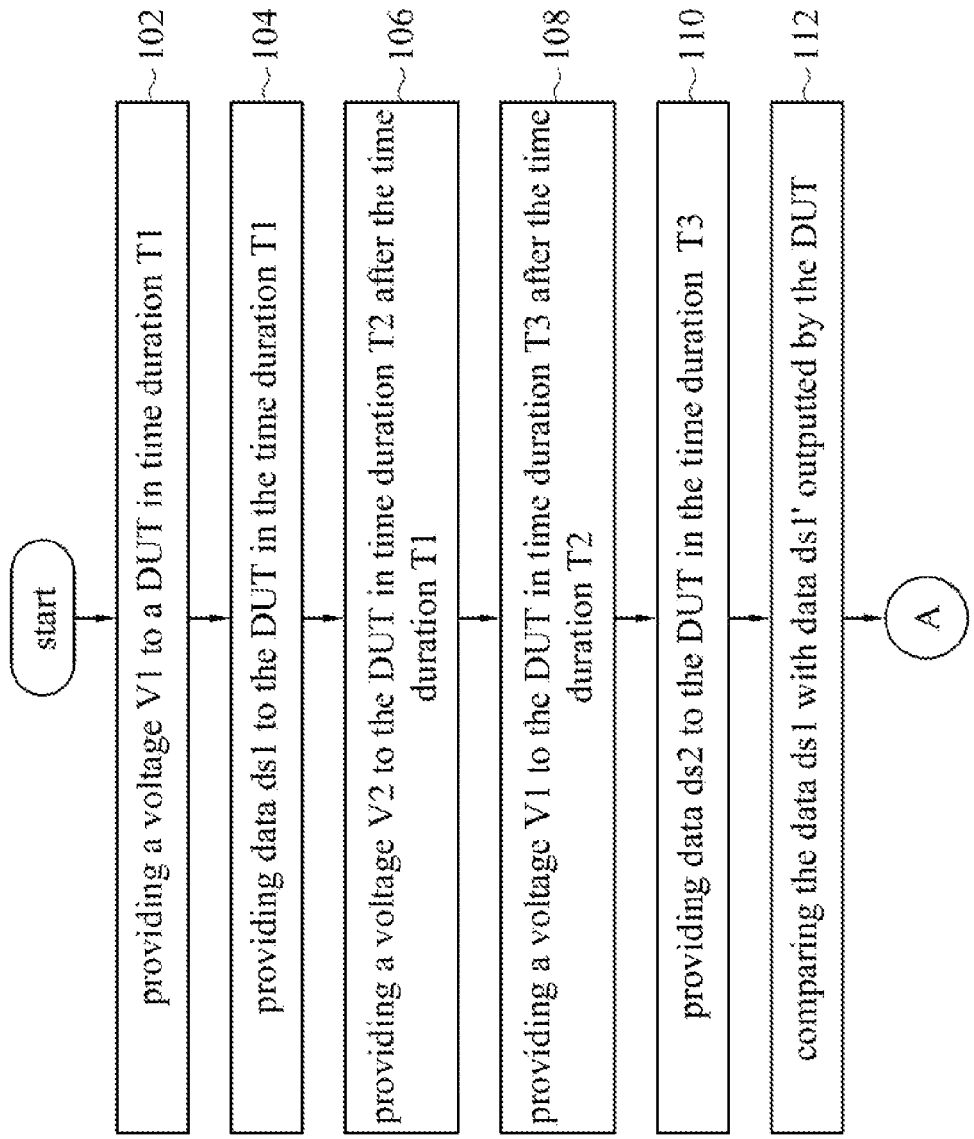
FIG. 7A illustrates a flowchart including various operations of a method for testing a DUT, in accordance with some embodiments of the present disclosure.

FIG. 7A illustrates a flowchart including various operations of a method for testing a DUT, in accordance with some embodiments of the present disclosure. FIG. 7A shows operations 102 to 112. The operations 102 to 112 can be performed by the apparatus 100 shown in FIG. 1. Although the operations 102 to 112 are depicted in a sequential manner, it does not mean that the operations 102 to 112 must be conducted according to the order shown in FIG. 7A.

In operation 102, a voltage V1 is provided to a DUT during a time duration T1. The voltage V1 can be provided, for example, by the power supply device 12 to a DUT 30 mounted on the load board 20. In operation 104, data ds1 is provided to the DUT during the time duration T1. The data ds1 can be provided, for example, by the data generating device 16 to a DUT 30 mounted on the load board 20. Although in FIG. 7A, the operation 102 is depicted as being followed by the operation 104, it can be contemplated that the operations 102 and 104 may be conducted in parallel.

In operation 106, a voltage V2 is provided to a DUT during a time duration T2 after the time duration T1. The voltage V2 can be provided, for example, by the power supply device 12 to a DUT 30 mounted on the load board 20. The voltage V2 can be different from the voltage V1. The voltage V2 can be lower than the voltage V1. In some embodiments, the level of the voltage V2 ranges from 20% to 80% of the level of the voltage V1. In some embodiments, the duration T2 may last, for example, greater than 100 ms.

In operation 108, a voltage V1 is provided to a DUT during a time duration T3 after the time duration T2. The voltage V1 can be provided, for example, by the power supply device 12 to a DUT 30 mounted on the load board 20. In operation 110, data ds2 is provided to the DUT during the time duration T3. The data ds2 can be provided, for example, by the data generating device 16 to a DUT 30 mounted on the load board 20. Although in FIG. 7A, the operation 108 is depicted as being followed by the operation 110, it can be contemplated that the operations 108 and 110 may be conducted in parallel. The purpose of feeding the data ds2 into the DUT 30 is to have the data stored in the DUT to be output by the DUT 30. Therefore, the data ds2 can include arbitrary combinations of bits "0" or "1."

In operation 112, the data ds1' outputted by the DUT 30 can be compared with the data ds1 provided during the time duration T1. The operation 112 can be conducted by, for example, the comparison device 18. The apparatus 100 can determine whether defects exist in the DUT 30 based on results provided by the comparison device 18. The apparatus 100 can determine whether defects exist in the DUT 30 based on the comparison between the data ds1 and the data ds1'.

Figure 7B:
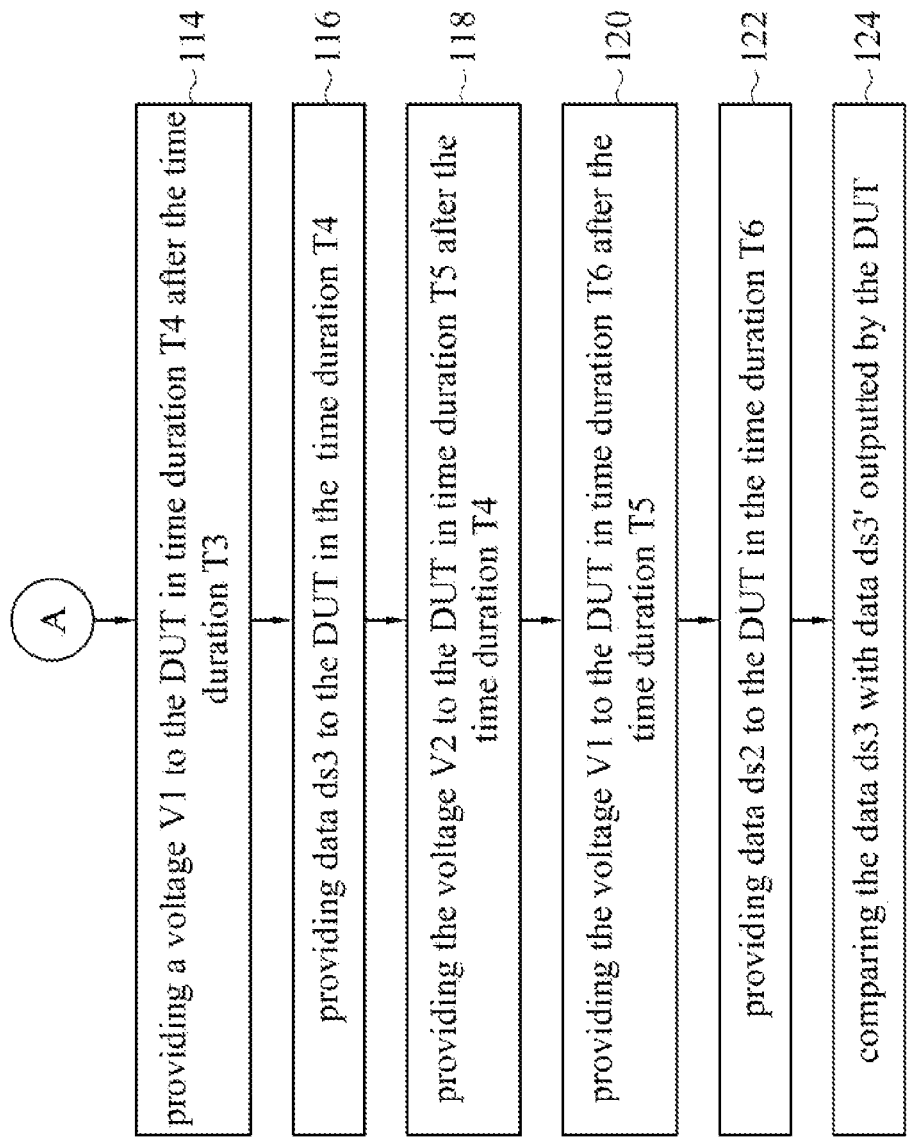
FIG. 7B illustrates a flowchart including various operations of a method for testing a DUT, in accordance with some embodiments of the present disclosure.

FIG. 7B illustrates a flowchart including various operations of a method for testing a DUT, in accordance with some embodiments of the present disclosure. FIG. 7B shows operations 114 to 124. The operations 114 to 124 can be performed by the apparatus 100 shown in FIG. 1. Although the operations 114 to 124 are depicted in a sequential manner, it does not mean that the operations 114 to 124 must be conducted according to the order shown in FIG. 7B.

The operation 114 shown in FIG. 7B can be conducted after the operation 112 of FIG. 7A. In operation 114, a voltage V1 is provided to a DUT during a time duration T4 after the time duration T3. The voltage V1 can be provided, for example, by the power supply device 12 to a DUT 30 mounted on the load board 20.

In operation 116, data ds3 is provided to the DUT during the time duration T4. The data ds3 can be provided, for example, by the data generating device 16 to a DUT 30 mounted on the load board 20. The data ds3 can be different from the data ds1 provided in the time duration T1. The data ds3 can have an identical number of bits to that of the data ds1. The data ds3 can have an identical number of digits to that of the data ds1. Although in FIG. 7B, the operation 114 is depicted as being followed by the operation 116, it can be contemplated that the operations 114 and 116 may be conducted in parallel.

In operation 118, a voltage V2 is provided to a DUT during a time duration T5 after the time duration T4. The voltage V2 can be provided, for example, by the power supply device 12 to a DUT 30 mounted on the load board 20. The voltage V2 can be different from the voltage V1. The voltage V2 can be lower than the voltage V1. In some embodiments, the level of the voltage V2 ranges from 20% to 80% of the level of the voltage V1. In some embodiments, the duration T2 may last, for example, greater than 100 ms.

In operation 120, a voltage V1 is provided to a DUT during a time duration T6 after the time duration T5. The voltage V1 can be provided, for example, by the power supply device 12 to a DUT 30 mounted on the load board 20. In operation 122, data ds2 is provided to the DUT during the time duration T6. The data ds2 can be provided, for example, by the data generating device 16 to a DUT 30 mounted on the load board 20. Although in FIG. 7B, the operation 120 is depicted as being followed by the operation 122, it can be contemplated that the operations 120 and 122 may be conducted in parallel. The purpose of feeding the data ds2 into the DUT 30 is to have the data stored in the DUT to be output by the DUT 30. Therefore, the data ds2 can include arbitrary combinations of bits "0" or "1."

In operation 124, the data ds3' outputted by the DUT 30 can be compared with the data ds3 provided during the time duration T4. The operation 124 can be conducted by, for example, the comparison device 18. The apparatus 100 can determine whether defects exist in the DUT 30 based on results provided by the comparison device 18. The apparatus 100 can determine whether defects exist in the DUT 30 based on the comparison between the data ds3 and the data ds3'.

The operations shown in FIGS. 6, 7A and 7B can also be referred to a power cycling screen method for detecting weak flip flops.

The operations shown in FIGS. 6, 7A and 7B can be used to check the data storage function of a DUT. The operations shown in FIGS. 6, 7A and 7B can be used to check the data storage function of a logic circuit. The operations shown in FIGS. 6, 7A and 7B can be used to detect tiny current leakage that exists in the flip flops. The operations shown in FIGS. 6, 7A and 7B can be used to detect tiny defects that exists in the flip flops.

The tiny current leakage may not be easily detected if no "power cycling" operation is involved. That is, the tiny current leakage may not be easily detected if a lower power (for example, the voltage V2) is provided to the DUT for a predetermined time duration (for example, the time duration T2).

Some embodiments of the present disclosure provide an apparatus for testing a device under test (DUT). The apparatus includes a power supply device and a data generating device. The power supply device is configured to provide a first voltage and a second voltage to the DUT. The data generating device is configured to provide first data to the DUT. The power supply device is configured to provide the first voltage to the DUT in a first time duration. The data generating device is configured to provide the first data to the DUT in the first time duration. The power supply device is configured to provide the second voltage to the DUT in a second time duration after the first time duration. The second voltage is different from the first voltage.

Some embodiments of the present disclosure provide a method for testing a logic device. The method includes providing a first voltage to the logic device in a first time duration. The method includes providing first data to the logic device in the first time duration. The method includes providing a second voltage to the logic device in a second time duration after the first time duration. In some embodiments, the second voltage is different from the first voltage.

Some embodiments of the present disclosure provide a method for testing a semiconductor device. The method includes providing a first voltage and first data to the semiconductor device. The method includes providing a second voltage different from the first voltage to the semiconductor device for a first time duration. The method includes providing the first voltage and second data to the semiconductor device. The method includes comparing the data outputted by the semiconductor device with the first data.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for testing a device under test (DUT), comprising:
   a power supply device configured to provide a first voltage in a first time duration and a second voltage in a second time duration to the DUT;
   a clock device configured to provide a clock signal to the DUT in the first time duration and stop providing the clock signal to the DUT in the second time duration; and
   a data generating device configured to provide first data to the DUT in the first time duration, wherein
   the second voltage is lower than the first voltage;
   the DUT comprises a first number of information storage units connected in series;
   the first data comprises a second number of bits; and
   the second number is identical to the first number.

2. The apparatus of claim 1, wherein the power supply device is further configured to provide the first voltage to the DUT in a third time duration after the second time duration, and wherein the data generating device is further configured to provide second data to the DUT in the third time duration.

3. The apparatus of claim 2, further comprising a comparison device, wherein the comparison device is configured to compare the first data with first output data outputted by the DUT, the first output data is generated by the DUT in response to the second data provided in the third time duration.

4. The apparatus of claim 1, wherein a ratio of the second voltage to the first voltage ranges from 80% to 20%.

5. The apparatus of claim 1, wherein the second time duration is greater than 100 ms.

6. The apparatus of claim 3, wherein:
   the data generating device is configured to provide third data different from the first data to the DUT in a fourth time duration after the third time duration;

the power supply device is configured to provide the first voltage to the DUT in the fourth time duration, and provide the second voltage to the DUT in a fifth time duration after the fourth time duration.

7. The apparatus of claim 6, wherein the clock device is configured to provide the clock signal to the DUT in the fourth time duration and stop providing the clock signal to the DUT in the fifth time duration.

8. The apparatus of claim 3, wherein the DUT is further configured to generate first output data in response to the second data provided in the third time duration.

9. The apparatus of claim 8, wherein the first output data comprises a third number of bits, wherein the third number is identical to the first number.

10. A method for testing a device under test (DUT), comprising:
providing a first voltage to the DUT in a first time duration;
providing first data to the DUT in the first time duration;
providing a clock signal to the DUT in the first time duration;
providing a second voltage lower than the first voltage to the DUT in a second time duration after the first time duration;
stopping providing the clock signal to the DUT in the second time duration;
providing the first voltage to the DUT in a third time duration after the second time duration;
providing second data to the DUT in the third time duration; and
comparing the first data with first output data outputted by the DUT, the first output data is generated by the DUT in response to the second data provided in the third time duration, wherein the DUT includes a first number of information storage units connected in series.

11. The method of claim 10, wherein a ratio between the second voltage to the first voltage ranges from 80% to 20%.

12. The method of claim 10, wherein the second time duration is greater than 100 ms.

13. The method of claim 10, further comprising:
providing third data to the DUT in a fourth time duration after the third time duration;
providing the first voltage to the DUT in the fourth time duration; and
providing the second voltage to the DUT in a fifth time duration after the fourth time duration, wherein the third data is different from the first data.

14. The method of claim 13, further comprising:
providing the first voltage to the DUT in a sixth time duration after the fifth time duration;
providing the second data to the DUT in the sixth time duration; and
comparing the third data with second output data outputted by the DUT,
the second output data is generated by the DUT in response to the second data provided in the sixth time duration.

15. The method of claim 10, wherein the first data includes a second number of bits, wherein the second number is identical to the first number.

16. The method of claim 13, further comprising: providing the clock signal to the DUT in the fourth time duration and stop providing the clock signal to the DUT in the fifth time duration.

17. A method for testing a semiconductor device having a first number of information storage units connected in series, comprising:
providing a first voltage and first data having a second number of bits to the semiconductor device;
providing a second voltage lower than the first voltage to the semiconductor device for a first time duration;
stopping providing a clock signal to the semiconductor device in the first time duration;
providing the first voltage and second data to the semiconductor device after the first time duration; and
comparing first output data outputted by the semiconductor device with the first data, wherein the second number is identical to the first number, and wherein the first output data is generated by the semiconductor device in response to the second data provided after the first time duration.

18. The method of claim 17, wherein a ratio between the second voltage to the first voltage ranges from 80% to 20%.

19. The method of claim 17, wherein the first time duration is greater than 100 ms.

20. The method of claim 17, further comprising:
providing the first voltage and third data different from the first data to the semiconductor device;
providing the second voltage to the semiconductor device for the first time duration;
providing the first voltage and the second data to the semiconductor device; and
comparing second output data outputted by the semiconductor device with the third data.

* * * * *